(12) United States Patent
Yoshioka et al.

(10) Patent No.: US 11,502,884 B2
(45) Date of Patent: Nov. 15, 2022

(54) PHASE PREDICTION DEMODULATOR CIRCUITS AND RELATED METHOD

(71) Applicant: Texas Instruments Incorporated, Dallas, TX (US)

(72) Inventors: Masahiro Yoshioka, Allen, TX (US); Michael Douglas Snedeker, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/362,480

(22) Filed: Jun. 29, 2021

(65) Prior Publication Data

US 2022/0014403 A1 Jan. 13, 2022

Related U.S. Application Data

(60) Provisional application No. 63/049,854, filed on Jul. 9, 2020.

(51) Int. Cl.

| | |
|---|---|
| *H04L 5/12* | (2006.01) |
| *H04L 23/02* | (2006.01) |
| *H04L 27/14* | (2006.01) |
| *H04L 27/16* | (2006.01) |
| *H04L 27/10* | (2006.01) |
| *H04W 4/80* | (2018.01) |

(52) U.S. Cl.
CPC ............ *H04L 27/14* (2013.01); *H04L 27/106* (2013.01); *H04L 27/16* (2013.01); *H04W 4/80* (2018.02)

(58) Field of Classification Search
CPC ....... H04L 27/14; H04L 27/106; H04L 27/16; H04L 7/033; H04W 4/80; H03D 3/04

USPC .......................................................... 375/262
See application file for complete search history.

(56) References Cited

U.S. PATENT DOCUMENTS

| | | | |
|---|---|---|---|
| 7,898,322 B1 * | 3/2011 | Lemkin | H04L 27/2337 329/302 |
| 8,050,643 B1 * | 11/2011 | Wu | H03G 3/3068 455/234.1 |
| 9,064,196 B1 * | 6/2015 | Gutnik | G06K 7/10207 |
| 2014/0009197 A1 * | 1/2014 | Yasuda | H03K 3/017 327/175 |

(Continued)

FOREIGN PATENT DOCUMENTS

WO WO-2016161438 A1 * 10/2016 ........... H04B 17/318

*Primary Examiner* — Tanmay K Shah
(74) *Attorney, Agent, or Firm* — Mark A. Valetti; Charles A. Brill; Frank D. Cimino

(57) ABSTRACT

An example apparatus includes: an input adapted to receive a signal modulated with data, counter circuitry coupled to the input and operable to determine a first count value in response to a first period between a first rising edge of the signal and a second rising edge of the signal, the first rising edge indicative of a start bit of the data, and determine a second count value based on a second period between a first falling edge of the signal and a second falling edge of the signal, data capture clock circuitry coupled to the counter circuitry and operable to generate a data capture clock based on the first count value in response to the second count value satisfying a threshold, and demodulator circuitry coupled to the counter circuitry and the data capture clock circuitry, the demodulator circuitry operable to generate a demodulated signal based on the data capture clock.

27 Claims, 6 Drawing Sheets

(56) References Cited

U.S. PATENT DOCUMENTS

| | | | | |
|---|---|---|---|---|
| 2017/0373709 A1* | 12/2017 | Kondo | ................... | H03L 7/091 |
| 2019/0273639 A1* | 9/2019 | Jose | ................... | H04L 25/0272 |
| 2022/0077860 A1* | 3/2022 | Ding | ..................... | H03K 5/131 |

* cited by examiner

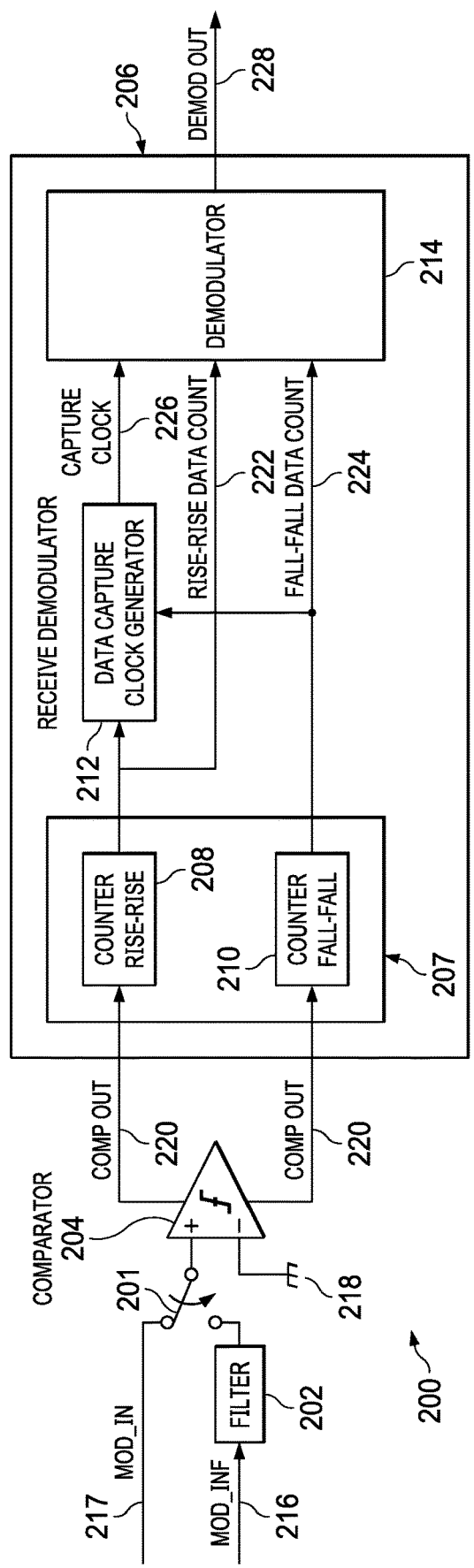
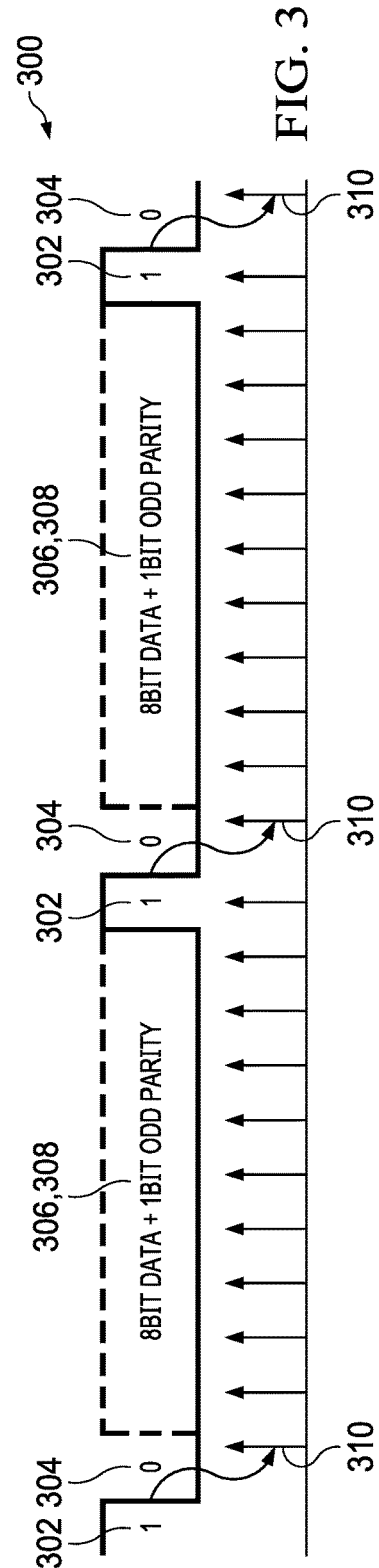
FIG. 2
FIG. 3

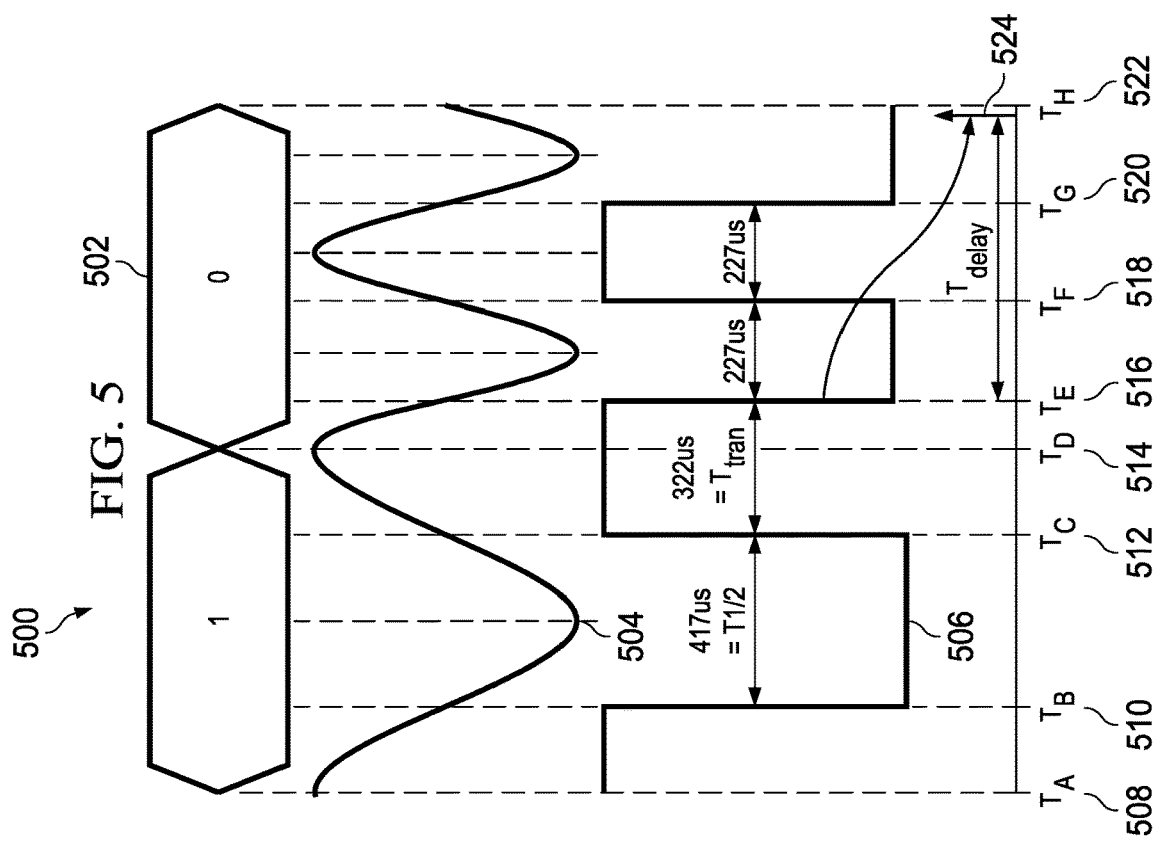
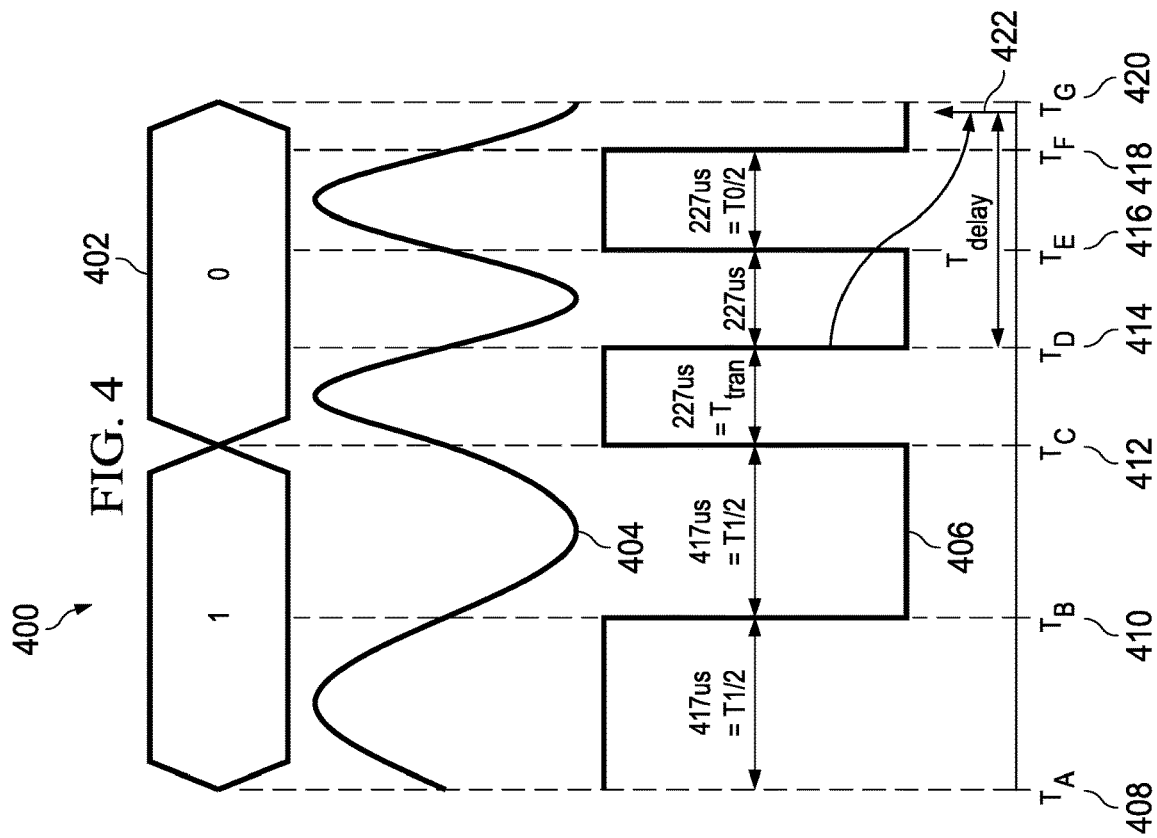

PHASE PREDICTION DEMODULATOR CIRCUITS AND RELATED METHOD

CROSS-REFERENCE TO RELATED APPLICATION

This patent application claims the benefit of and priority to U.S. Provisional Patent Application No. 63/049,854 filed Jul. 9, 2020, which is incorporated herein by reference in its entirety.

TECHNICAL FIELD

This description relates generally to circuits, and more particularly to phase prediction demodulator circuits and related method.

BACKGROUND

Some industrial communication protocols, such as the Highway Addressable Remote Transducer (HART) communication protocol, may be implemented with hybrid analog and digital communication techniques. The HART protocol is implemented by Frequency Shift Keying (FSK) to superimpose digital communication signals (e.g. device status, diagnostic information, and other measured or calculated values) at a low level on top of an analog signal, such as a 4-20 milliamp signal. A HART device may identify a measured value, such as a sensor measurement, based on the analog signal. The HART device may identify additional data based on the digital signal that is superimposed on the analog signal.

SUMMARY

For phase prediction demodulator circuits and related method, an example apparatus includes an input adapted to receive a signal modulated with data, counter circuitry coupled to the input and operable to determine a first count value in response to a first period between a first rising edge of the signal and a second rising edge of the signal, the first rising edge indicative of a start bit of the data, and determine a second count value based on a second period between a first falling edge of the signal and a second falling edge of the signal, data capture clock circuitry coupled to the counter circuitry and operable to generate a data capture clock based on the first count value in response to the second count value satisfying a threshold, and demodulator circuitry coupled to the counter circuitry and the data capture clock circuitry, the demodulator circuitry operable to generate a demodulated signal based on the data capture clock.

BRIEF DESCRIPTION OF THE DRAWINGS

FIG. 2 is a schematic diagram of an example implementation of the demodulator of FIG. 1.

FIG. 3 depicts an example implementation of an industrial communication protocol.

FIGS. 4, 5, and 6 depict example timing diagrams corresponding to example operation of the example demodulator of FIGS. 1 and/or 2.

The same reference numbers or other reference designators are used in the drawings to designate the same or similar (functionally and/or structurally) features.

DETAILED DESCRIPTION

Figure 1:
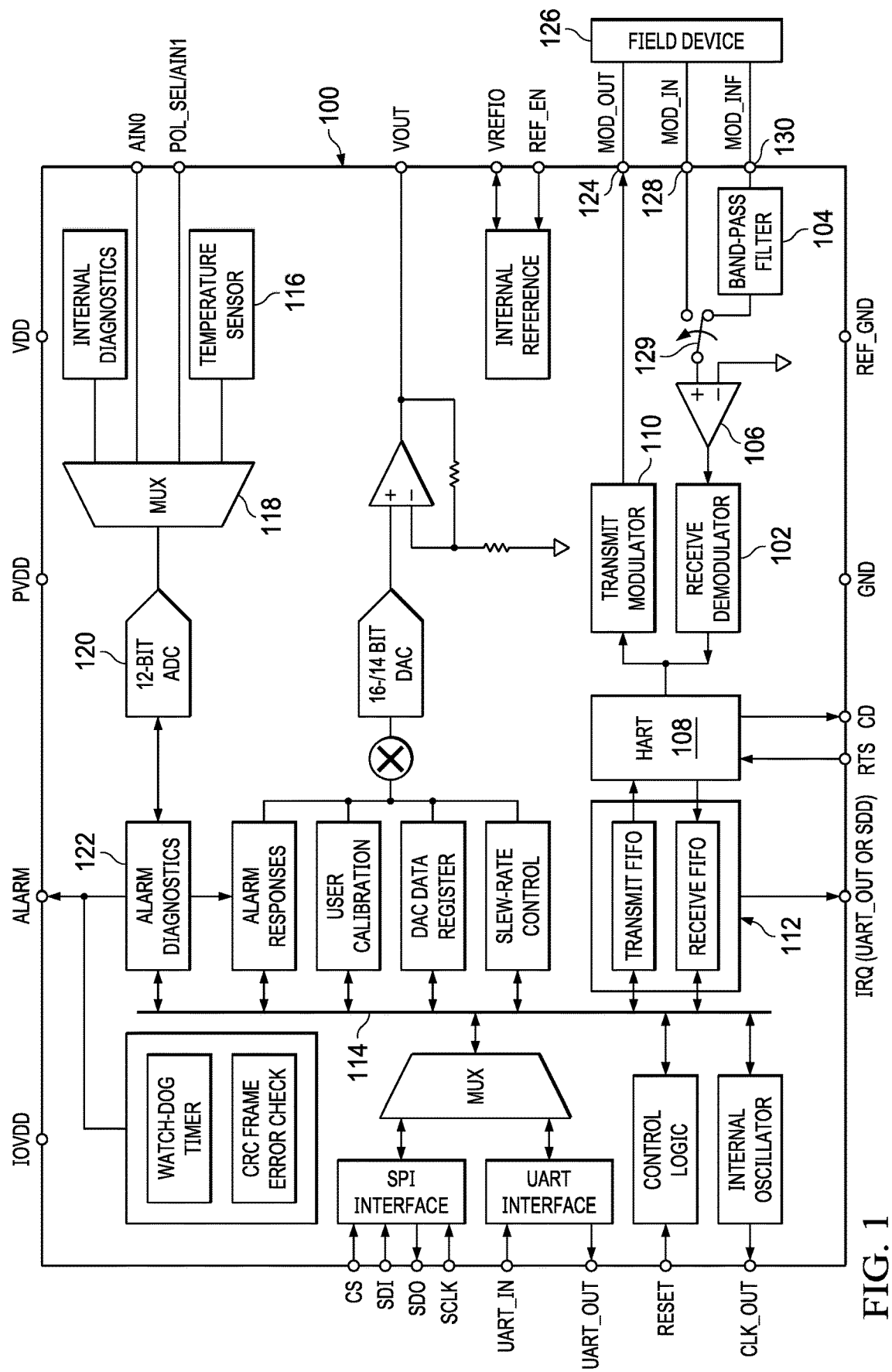
FIG. 1 is a schematic diagram of an example Highway Addressable Remote Transducer (HART) device including an example demodulator to adjust a phase of a data capture clock based on a modulated signal.

Industrial communication protocols, such as the Highway Addressable Remote Transducer communication protocol, may be used to implement communication of data between devices, such as field devices in process control systems. For example, a field device may be an actuator (e.g., a motor, a valve, etc.), a computing device (e.g., a programmable logic controller (PLC), an input/output (I/O) module, etc.), a sensor (e.g., a flowmeter, a pressure sensor, a temperature sensor, etc.), etc. In some such examples, a host or primary device may request data from the field device and a receiver of the host or primary device may receive the requested data from the field device.

The Highway Addressable Remote Transducer (HART) protocol is a wired communication protocol implemented with Frequency Shift Keying (FSK). The HART protocol is based on phase continuous FSK analog waveforms without a synchronous clock between a transmitter and a receiver. The HART protocol may be used to transmit digital data or information through discrete frequency changes of a carrier signal. For example, the HART protocol may communicate a single variable using a 4-20 milliamp (mA) analog signal, while also communicating added information on a digital signal. In some such examples, the digital information may be carried by a low-level modulation superimposed on the 4-20 mA analog signal.

As the HART protocol is implemented without a synchronous clock between the transmitter and the receiver, the receiver may need to regenerate a data capture clock from the FSK analog waveforms as well as demodulated data. Some HART devices include receive circuitry that may include a 1-bit comparator based demodulator to demodulate a modulated signal from a field device. Some such demodulators may generate a capture clock to trigger the demodulator to capture data embedded within the modulated signal. Some such demodulators may not have accurate data capture clock regeneration due to a lack of phase and slope data of the modulated signal. Inaccurate data capture clock regeneration may cause the demodulator to capture an incorrect data count and lower tolerance against injected noise and waveform shape variations, which may lead to demodulation failures. Some HART devices may utilize a multi-bit analog-to-digital converter (ADC) instead of the 1-bit comparator based demodulator. Some such HART devices have increased size and higher power consumption with respect to the 1-bit comparator based demodulators. Some HART devices utilize a constant delay time to generate a capture clock. Some such HART devices may suffer from a high error rate.

Examples disclosed herein include an example demodulator that may regenerate a capture clock at data transitions. The example demodulator may detect a data1 (e.g., data indicative of a logic '1') to a data0 (e.g., data indicative of a logic '0') transition in a modulated signal during a data cycle (e.g., an 11-bit data cycle for a HART packet). The example demodulator may regenerate the capture clock at such a transition. The example demodulator may detect changes in pulse widths of the modulated signal. The example demodulator may predict and/or otherwise determine when a transition from a data1 to a data0 is to occur based on the detected pulse width changes. Advantageously, the example demodulator may adjust a phase of a capture clock based on the detected pulse width changes for improved and/or otherwise optimal capture clock regeneration. For example, the demodulator may determine the adjusted phase based on the detected pulse width changes. In some such examples, the demodulator may determine that a first phase of the capture clock (e.g., a first position of the modulated signal at which the capture clock is to be generated) is to be adjusted to a second phase (e.g., a second phase of the modulated signal at which the capture clock is to be generated).

FIG. 1 is a schematic diagram of an example HART device 100 including example receive demodulator 102 to adjust a phase of a data capture clock based on a modulated signal. The HART device 100 may be a host device (such as a computing device) or a peripheral device (such as a field device, a valve, a sensor or other equipment). In some examples, the HART device 100 may implement a 4-20 mA, 2-wire loop-powered sensor transmitter. For example, the HART device 100 may be included in a field device, a PLC, an I/O module, etc.

The HART device 100 includes an example filter 104, an example comparator 106, an example HART modem 108, an example transmit modulator 110, an example buffer 112, an example bus 114, an example sensor 116, an example multiplexer 118, an example ADC 120, and example alarm diagnostics 122. In this example, the filter 104 is a band-pass filter (e.g. a digital filter or an analog filter). Alternatively, the filter 104 may be any other type of filter. In this example, the HART modem 108 is an FSK modem. In this example, the HART modem 108 may implement HART modem circuitry (e.g., a HART modem circuit, one or more HART modem circuits, etc.), HART logic circuitry (e.g., a HART logic circuit, one or more HART circuits, a HART logic circuit, one or more HART logic circuits, etc.), etc. In this example, the buffer 112 includes a transmit first-in first-out (FIFO) buffer and a receive FIFO buffer (in other examples, the buffer 112 may be implemented using any type of memory). In this example, the bus 114 is an integrated circuit (IC) bus (e.g., a chip-to-chip bus, an interchip communications bus, etc., and may be a serial bus). In this example, the sensor 116 is a temperature sensor. Alternatively, the HART device 100 may implement any other type of field device, sensor, transmitter, etc. In this example, the ADC 120 is a 12-bit ADC. Alternatively, the ADC 120 may be any other ADC.

In this example, output(s) of the sensor 116 is/are coupled to input(s) of the multiplexer 118. Output(s) of the multiplexer 118 is/are coupled to input(s) of the ADC 120. Output(s) of the ADC 120 is/are coupled to input(s) of the alarm diagnostics 122. Output(s) of the alarm diagnostics 122 is/are coupled to the bus 114. The bus 114 is coupled to the buffer 112. Input(s) and/or output(s) of the buffer 112 are coupled to respective input(s) and output(s) (e.g., HART output(s), HART circuit output(s), HART modem output(s), etc.) of the HART modem 108. Input(s) (e.g., HART input(s), HART circuit input(s), HART modem input(s), etc.) of the HART modem 108 is/are coupled to output(s) of the receive demodulator 102. Output(s) of the HART modem 108 is/are coupled to input(s) of the transmit modulator 110.

In this example, output(s) (e.g., demodulator output(s), receive demodulator output(s), etc.) of the receive demodulator 102 is/are coupled to input(s) of the transmit modulator 110. Output(s) of the transmit modulator 110 is/are coupled to an example modulator output terminal 124. The modulator output terminal 124 is coupled to an example field device 126. For example, the modulator output terminal 124 is configured and/or adapted to be coupled to input(s) of the field device 126. Output(s) of the field device 126 is/are adapted and/or configured to be coupled to a first example modulator input terminal 128 and a second example modulator input terminal 130. For example, the first modulator input terminal 128 may implement a non-filtered input and/or the second modulator input terminal 130 may implement a filtered input (e.g., an input configured to be coupled to one or more filters). The first modulator input terminal 128 is coupled to input(s) of the comparator 106 by an example switch 129. For example, the first modulator input terminal 128 may be coupled to a first switch terminal of the switch 129. In some examples, the switch 129 is a transistor (such as a metal-oxide semiconductor field-effect transistor (MOSFET), a field-effect transistor (FET), an insulated gate bipolar transistor (IGBT), a bipolar junction transistor (BJT), etc.) The second modulator input terminal 130 is coupled to input(s) of the filter 104. Output(s) of the filter 104 is/are coupled to second input(s) of the comparator 106 by the switch 129. For example, the output(s) of the filter 104 may be coupled to a second switch terminal of the switch 129. In this example, the input(s) of the comparator 106 may be coupled to a third switch terminal of the switch 129. Output(s) of the comparator 106 is/are coupled to input(s) (e.g., demodulator input(s), receive demodulator input(s), etc.) of the receive demodulator 102.

In example operation, the sensor 116 outputs measurement data (e.g., analog data representative of a sensor measurement, a temperature reading, etc.) to the multiplexer 118. The multiplexer 118 may provide the measurement data to the ADC 120 to convert the analog measurement data into digital measurement data. The ADC 120 may provide the digital measurement data to the alarm diagnostics 122 to detect any alarm conditions based on the digital measurement data. The alarm diagnostics 122 may provide the digital measurement data to the buffer 112 (via the bus 114) to be stored in at least one of the transmit FIFO or the receive FIFO.

In example operation, the field device 126 may request the digital measurement data. For example, the HART device 100 may be implemented by a field device and the field device 126 may be a computing device (e.g., a programmable processor such as a PLC), an I/O module, etc. The field device 126 may request the digital measurement data by transmitting a modulated signal representative of the request (via, for example, the input terminal 128 and/or the input terminal 130). For example, the modulated signal may implement one or more HART commands. For example, the modulated signal may implement a read primary variable (PV) and units command, a read current output and percent of range command, etc. Alternatively, the HART device 100 may request data from the field device 126.

In example operation, the filter 104 may receive the modulated signal and remove frequencies not within a pre-determined frequency band. The comparator 106 may compare the filtered modulated signal to a threshold (not shown in FIG. 1). The comparator 106 may output a first signal indicative of a digital or logic '1' in response to the filtered modulated signal being greater than the threshold. The comparator 106 may output a second signal indicative of a digital or logic '0' in response to the filtered modulated signal being less than the threshold. The receive demodulator 102 may detect changes in a pulse width of pulses of one(s) of the first signal, the second signal, etc. The receive demodulator 102 may predict and/or otherwise determine data transitions (e.g., a transition from a data1 to a data0) and generate a capture clock based on the predicted data transitions. Advantageously, the receive demodulator 102 may dynamically generate the capture clock to achieve improved and/or otherwise optimal capture of data included in and/or otherwise associated with the filtered demodulated signal.

In example operation, in response to the generation of the capture clock, the receive demodulator 102 may demodulate the filtered demodulated signal and provide the demodulated signal to the HART modem 108. The HART modem may detect and/or otherwise identify the request from the field device 126 based on the demodulated signal. The HART modem 108 may determine that the field device 126 is requesting the digital measurement data. The HART modem 108 may retrieve the digital measurement data from the buffer 112 and provide the digital measurement data to the transmit modulator 110 for transmission to the field device 126.

FIG. 2 is a schematic diagram of an example demodulator system 200 including an example switch 201, an example filter 202, an example comparator 204, and an example receive demodulator 206. In some examples, the demodulator system 200 of FIG. 2 may be an implementation of the filter 104, the comparator 106, and/or the receive demodulator 102 of FIG. 1. In some examples, the receive demodulator 206, and/or, more generally, the demodulator system 200, may implement a 1-bit comparator-based HART demodulator. In this example, the receive demodulator 206 includes example counter circuitry 207, which includes a first example counter 208 and a second example counter 210. In this example, the receive demodulator 206 includes an example data capture clock generator 212 and an example demodulator 214. In this example, one or more of the filter 202, the comparator 204, the receive demodulator 206, the counter circuitry 207, the first counter 208, the second counter 210, the data capture clock generator 212, the demodulator 214, and/or, more generally, the demodulator system 200, may be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)), and/or field programmable logic device(s) (FPLD(s)) (e.g., field programmable gate array(s) (FPGA(s))). Alternatively, one or more of the aforementioned components may be implemented by any other type of hardware logic, machine readable instructions, hardware implemented state machines, and/or any combination thereof.

The demodulator system 200 may be implemented by one or more integrated circuits (ICs) in one or more IC packages. For example, the filter 202 may be implemented by a first IC in a first IC package, the comparator 204 may be implemented by a second IC in a second IC package, and the receive demodulator 206 may be implemented by a third IC in a third IC package. Alternatively, one or more of the counter circuitry 207, the first counter 208, the second counter 210, the data capture clock generator 212, and/or the demodulator 214 may be each implemented by one or more ICs. Alternatively, one or more of the counter circuitry 207, the first counter 208, the second counter 210, the data capture clock generator 212, and/or the demodulator 214 may be included in the first IC and/or the second IC. In some examples, the demodulator system 200 may be implemented by a single IC package including one or more ICs.

In some examples, the switch 201 may implement the switch 129 of FIG. 1. In some examples, the filter 202 may implement the filter 104 of FIG. 1. For example, the filter 202 may implement a band-pass filter. Alternatively, the filter 202 may be implemented by any other type of filter and/or any quantity of filters. In some such examples, input(s) of the filter 202 may be coupled to the second modulation input terminal 130. In some examples, the comparator 204 may implement the comparator 106 of FIG. 1. In some examples, the receive demodulator 206 may implement the receive demodulator 102 of FIG. 1. For example, output(s) of the receive demodulator 206 may be coupled to at least one of the HART modem 108 or the transmit modulator 110 of FIG. 1.

In this example, input(s) (e.g., a filter input, filter input(s), etc.) of the filter 202 is/are configured to receive a first example signal input (MOD_INF) 216. Output(s) (e.g., a filter output, filter output(s), etc.) of the filter 202 is/are coupled to a first switch terminal of the switch 201. A terminal that may provide a second example signal input (MOD_IN) 217 is coupled to a second switch terminal of the switch 201. For example, the terminal may implement the first modulated input 128 of FIG. 1. In some examples, the first signal input 216 may implement the MOD_IN signal of FIG. 1. In some examples, the second signal input 217 may implement the MOD_INF signal of FIG. 1. A third switch terminal of the switch 201 is coupled to a first input (e.g., a first comparator input) of the comparator 204. A second input of the comparator 204 is coupled to ground 218. In this example, the ground 218 may be an alternating current (AC) ground because the filter 202 may have a direct current (DC) common mode voltage. Alternatively, the ground 218 may be any other type of ground. Output(s) (e.g., comparator output(s)) of the comparator 204 is/are coupled to the receive demodulator 206. For example, a first output of the comparator 204 is coupled to an input (e.g., a counter input) of the first counter 208 and a second output of the comparator is coupled to an input of the second counter 210. In some such examples, the first output and/or the second output of the comparator 204 is configured to output an example comparator output signal (COMP OUT) 220.

In this example, output(s) of the first counter 208 is/are coupled to input(s) of the data capture clock generator 212 and the demodulator 214. For example, a first output (e.g., a first counter output) of the first counter 208 is coupled to a first input of the data capture clock generator 212 and a second output of the first counter 208 is coupled to a first input of the demodulator 214. In some such examples, the first output of the first counter 208 is configured to output a first example data count signal (RISE-RISE DATA COUNT) 222. In some such examples, the second output of the second counter 210 is configured to output a second example data count signal (FALL-FALL DATA COUNT) 224.

In this example, output(s) of the second counter 210 is/are coupled to input(s) of the data capture clock generator 212 and the demodulator 214. For example, a first output (e.g., a first counter output) of the second counter 210 is coupled to a second input of the data capture clock generator 212 and a second output of the second counter 210 is coupled to a second input of the demodulator 214.

In some examples, the counter circuitry 207 may implement the first counter 208 and the second counter 210 as a single counter or more than two counters. For example, the counter circuitry 207 may include and/or otherwise implement a single rise-to-fall/fall-to-rise counter. In some such examples, the counter circuitry 207 may include a counter (e.g., a counter circuit) that detects and/or otherwise measures a first count value representative of a first time duration from a first rising edge to a first falling edge of the comparator output signal 220. In some such examples, the counter circuitry 207 may include the counter to detect and/or otherwise measure a second count value representative of a second time duration from the first falling edge to a second rising edge of the comparator output signal 220.

In this example, an output of the data capture clock generator 212 is coupled to an input of the demodulator 214. For example, an output of the data capture clock generator 212 may be coupled to a third input of the demodulator 214. In some such examples, the output of the data capture clock generator 212 is configured to output an example capture clock (CAPTURE CLOCK) 226. In some examples, an output of the demodulator 214 is coupled to an input of the HART modem 108. In some such examples, the output of the demodulator 214 is configured to output an example demodulator output (DEMOD OUT) 228.

In some examples, the demodulator 214 may implement a FSK demodulator. For example, the first input signal 216 and/or the second input signal 217 may be translated into data counts (e.g., pulse widths), which may be implemented by the first data count signal 222 and/or the second data count signal 224. For example, the filter 202, the comparator 204, and the counter circuitry 207 may translate and/or otherwise convert the first input signal 216 and/or the second input signal 217 into the first data count signal 222 and/or the second data count signal 224 that may be provided to the demodulator 214 for FSK demodulation.

In example operation, the filter 202 receives the first input signal 216 (e.g. a modulated signal from the field device 126 of FIG. 1). In some such examples, the first input signal 216 may be a HART signal (e.g., a HART FSK signal, an asynchronous HART FSK signal, a modulated HART signal, etc.). In some such examples, the first input signal 216 may be implemented by an example HART signal 300 depicted in FIG. 3.

In example operation, the switch 201 receives the second input signal 217 (e.g. a modulated signal from the field device 126 of FIG. 1). In some such examples, the second input signal 217 may be a HART signal (e.g., a HART FSK signal, an asynchronous HART FSK signal, a modulated HART signal, etc.). In some such examples, the second input signal 217 may be implemented by the HART signal 300 depicted in FIG. 3.

Turning to the illustrated example of FIG. 3, the HART signal 300 is implemented with a bit stream including an example stop bit 302, an example start bit 304, example payload data 306, and an example odd parity bit 308. For example, the HART signal 300 may implement a communication message, a communication signal, etc., based on an industrial communication protocol such as the HART protocol.

In this example, a first bitstream of the HART signal 300 includes 11 bits, which includes the stop bit 302, the start bit 304, 8 bits of the payload data 306, and the odd parity bit 308. A second bit stream begins at a subsequent transition from another stop bit to another start bit. In this example, the stop bit 302 may implement a data1 bit (e.g., a logical "high" bit) and the start bit 304 may implement a data0 bit (e.g., a logical "low" bit) and the transition between the stop bit 302 to the start bit 304 may implement a data1 to a data0 transition. For example, the stop bit 302 may implement a digital signal representative of and/or indicative of a logic '1' and the start bit 304 may implement a digital signal representative of and/or indicative of a logic '0'.

In the illustrated example of FIG. 3, the data capture clock generator 212 of FIG. 2 may generate example capture clocks 310 to capture data of the HART signal 300. For example, the data capture clock generator 212 may generate a first one of the capture clocks 310 to capture the start bit 304. In this example, the data capture clock generator 212 may generate the first one of the capture clocks 310 in response to a detection of a transition from the stop bit 302 to the start bit 304.

Turning back to the illustrated example of FIG. 2, the filter 202 may obtain the first input signal 216. For example, the filter 202 may obtain the HART signal 300 of FIG. 3 and filter the HART signal 300 to output a filtered HART signal (e.g., a filtered modulated signal). For example, the filter 202 may remove frequencies not within a pre-defined bandwidth to implement a band-pass filter. The filter 202 may output the filtered modulated signal to the first input of the comparator 204. The comparator 204 may compare a first voltage of the filtered modulated signal to a second voltage, which in this example is a ground voltage. The comparator 204 may output the comparator output signal 220 as representative of a logic '1' in response to the first voltage being greater than the ground voltage and thereby satisfying a threshold voltage implemented by the comparator 204. The comparator 204 may output the comparator output signal 220 as representative of a logic '0' in response to the comparator 204 determining that the first voltage is less than the second voltage and thereby determine that the first voltage does not satisfy the threshold voltage.

The first counter 208 and the second counter 210 may receive the comparator output signal 220 from the comparator 204. The first counter 208 may be configured to determine a first time duration between rising edges of the comparator output signal 220. For example, the first counter 208 may count and/or otherwise measure a period between rising edges of the comparator output signal 220. In some such examples, the first counter 208 may be configured to output a first count value (e.g., a first count measurement, a measurement of the first counter 208, etc.) based on the first time duration. In some examples, the first counter 208 may include and/or otherwise implement a first edge detector. For example, the first counter 208 may detect a rising edge of the comparator output signal 220. In some such examples, the first counter 208 may be reset (e.g., reset a counter implemented by the first counter 208) in response to the detection of the rising edge of the comparator output signal 220.

The second counter 210 may be configured to determine a second time duration (e.g., a period) between falling edges of the comparator output signal 220. For example, the second counter 210 may be configured to output a second count value (e.g., a second count measurement, a measurement of the second counter 210, etc.) based on the second time duration. In some examples, the second counter 210 may include and/or otherwise implement a second edge detector. For example, the second counter 210 may detect a falling edge of the comparator output signal 220. In some such examples, the second counter 210 may be reset (e.g., reset a counter implemented by the second counter 210) in response to the detection of the falling edge of the comparator output signal 220.

The data capture clock generator 212 may determine a bit count of the first input signal 216 and/or the second input signal 217. For example, the data capture clock generator 212 may determine that an instant portion of the first input signal 216 and/or the second input signal 217 corresponds to the stop bit 302, the start bit 304, one or more of the data bits of the payload data 306, the odd parity bit 308, etc., of FIG. 3 based on the first data count signal 222 and/or the second data count signal 224.

The data capture clock generator 212 may generate the capture clock 226 based on the bit count of the first input signal 216 and/or the second input signal 217. In response to the generation of the capture clock 226, the demodulator 214 may demodulate the first input signal 216 and/or the second input signal 217. The demodulator 214 may provide the demodulated input signal as the demodulated output 228. In some examples, the HART modem 108 of FIG. 1 may detect a HART parameter, a HART command, etc., based on the demodulated output 228.

In some examples, the capture clock 226 may generate the capture clocks 310 of FIG. 3. For example, the data capture clock generator 212 may detect a data transition from the stop bit 302 to the start bit 304. In this example, each of the bits of the HART signal 300 has a fixed length of time, which may be determined by the baud rate of the HART signal 300. In some examples, the data capture clock generator 212 may predict a delay time for a data capture clock edge.

In some examples, the data capture clock generator 212 may determine a delay time to the next data capture clock regardless of an initial phase of the stop bit 302. In some examples, the data capture clock generator 212 may determine the delay time $T_{delay}$ based on the example of Equation (1) below:

$$T_{delay} = T_1 - \frac{T_0}{2}\left(\frac{T_1 - 2T_{tran}}{T_1 - T_0}\right) \quad (1)$$

where, $T_0$ may correspond to the data0 period (e.g., a period of the start bit 304), $T_1$ may correspond to the data1 period (e.g., a period of the stop bit 302), $T_{tran}$ may correspond to a transition pulse width and $T_{delay}$ may correspond to the delay time until a new capture clock is generated. For example, $T_0$ may be the period of the data0 carrier and $T_1$ may be the period of the data1 carrier. The data capture clock generator 212 may determine $T_0$, $T_1$, and $T_{tran}$ based on at least one of the first data count signal 222 or the second data count signal 224. Additionally, the data capture clock generator 212 may calculate, predict, and/or otherwise determine $T_{delay}$, which may correspond to a time duration between falling edges of a data0 signal (e.g., the start bit 304) after a data1 signal (e.g., the start bit 302).

Due to the lack of phase and slope data of the first input signal 216 and/or the second input signal 217, prior HART demodulators suffered from inaccurate data capture clock regeneration and lack of anticipation of the time duration between falling edges of the stop bit 302 and the start bit 304. Advantageously, the data capture clock generator 212 may determine the delay time for a data capture clock edge based on the first data count signal 222 and/or the second data count signal 224. Advantageously, the data capture clock generator 212, and/or, more generally, the demodulator system 200, may regenerate a data capture clock from a 1-bit comparator signal, which is implemented by the comparator output 220.

FIG. 4 depicts a first example timing diagram 400 including example waveforms 402, 404, 406 corresponding to example operation of the HART device 100 of FIG. 1 and/or the demodulator system 200 of FIG. 2. The first waveform 402 is representative of digital transmission data that is modulated using FSK modulation to obtain the second waveform 404. For example, the second waveform 404 may be an example of the signal received from the field device 126 of FIG. 1, the output of the filter 104 of FIG. 1, the first input signal 216 of FIG. 2, the second input signal 217 of FIG. 2, the output of the filter 202 of FIG. 2, and/or the HART signal 300 of FIG. 3. The second waveform 404 is an example of digital data 402 modulated (using FSK) on a 4-20 mA signal. The third waveform 406 is a comparator output signal. For example, the third waveform 406 is an example of the output of the comparator 106 of FIG. 1 and/or the comparator 204 of FIG. 2. In some such examples, the third waveform 406 is an example of the comparator output signal 220 of FIG. 2.

In the first timing diagram 400, the second waveform 404 is indicative of a data1 value from a first example time ($T_A$) 408 until a third example time ($T_C$) 412. The second waveform 404 is indicative of a data0 value from the third time 412 until a seventh example time ($T_G$) 420. The data1 has a period of T1, which may implement $T_1$ in the example of Equation (1) above. In this example, the period of T1 is 834 microseconds (us) with a half period of 417 us (e.g., from the first time 408 to a second example time ($T_B$) 410, from the second time 410 to the third time 412, etc.). In this example, the transition from the data1 to the data0 occurs at the third time 412. In this example, $T_{tran}$ is defined as a first pulse width at the data transition from data1 to data0 (e.g. the period from $T_C$ 412 to $T_D$ 414. In this example, the transition interval is 227 us. The data0 has a period of $T_0$. In this example, the period of $T_0$ is 454 us with a half period of 227 us (e.g., from a fourth example time ($T_D$) 414 to a fifth example time ($T_E$) 416, from the fifth time 416 to a sixth example time ($T_F$) 418, etc.).

In the first timing diagram 400, the data capture clock generator 212 may measure the period of data1 based on the first data count signal 222 and/or the second data count signal 224. The data capture clock generator 212 may measure the period of data0 based on the first data count signal 222 and/or the second data count signal 224. The data capture clock generator 212 may generate an example capture clock 422 (e.g., the capture clock 226 of FIG. 2 and/or the capture clocks 310 of FIG. 3) based on the period of data0 and/or the period of data1. In this example, the time duration between the falling edge of the third waveform 406 at the fourth time 414 and the generation of the capture clock 422 at the seventh time 420 is $T_{delay}$. Advantageously, the data capture clock generator 212 may generate the capture clock 422 based on $T_{delay}$, which may be determined based on $T_{tran}$.

FIG. 5 depicts a second example timing diagram 500 including example waveforms 502, 504, 506 corresponding to example operation of the HART device 100 of FIG. 1 and/or the demodulator system 200 of FIG. 2. The first waveform 502 is representative of digital transmission data that is modulated using FSK modulation to obtain the second waveform 504. For example, the second waveform 504 may be an example of the signal received from the field device 126 of FIG. 1, the output of the filter 104 of FIG. 1, the first input signal 216 of FIG. 2, the second input signal 217 of FIG. 2, the output of the filter 202 of FIG. 2, and/or the HART signal 300 of FIG. 3. The second waveform 504 is an example of digital data 502 modulated (using FSK) on a 4-20 mA signal. The third waveform 506 is a comparator output signal. For example, the third waveform 506 is an example of the output of the comparator 106 of FIG. 1 and/or the comparator 204 of FIG. 2. In some such examples, the third waveform 506 is an example of comparator output signal 220 of FIG. 2.

The second waveform 504 illustrates a data1 value from a first example time ($T_A$) 508 until a fourth example time ($T_D$) 514. The second waveform 504 illustrates a data0 value from the fourth time 514 until an eighth example time ($T_H$) 522. The data1 has a period of T1, which, in this example, is 834 microseconds (us) with a half period of 417 us (e.g., from the first time 508 to the fourth time 514). In this example, the half period of 417 us may span from a second example time ($T_B$) 510 until a third example time ($T_C$) 512. In this example, the transition from the data1 to the data0 is the transition interval $T_{tran}$, which, in this example, is 322 us. The transition interval may span from the third time 512 until a fifth example time ($T_E$) 516. The data0 has a period of $T_0$, which, in this example, is 454 us with a half period of 227 us (e.g., from the fifth time 516 to a sixth example time ($T_F$) 518, from the sixth time 518 to a seventh example time ($T_G$) 520, etc.).

In the second timing diagram 500, the data capture clock generator 212 may determine the period of data1 based on the first data count signal 222 and/or the second data count signal 224, and it may determine the period of data0 based on the first data count signal 222 and/or the second data count signal 224. The data capture clock generator 212 may generate an example capture clock 524 (e.g., the capture clock 226 of FIG. 2 and/or the capture clocks 310 of FIG. 3) based on the period of data0 and/or the period of data1.

In this example, the fourth time 514 is representative of the transition between the data1 and the data 0. For example, the transition between the data1 and the data0 may occur during $T_{tran}$. Advantageously, the example of Equation (1) above may be utilized to determine when during $T_{tran}$ the transition occurred, which may be utilized to generate the capture clock 524. The falling edge at the fifth time 516 occurs during the expected time frame for the data0. Due to the lack of phase and slope data of the second waveform 504, the expected time of the transition between the data1 and the data0 may be different from one bit stream to another bit stream. In this example, the time duration between the falling edge of the third waveform 506 at the fifth time 516 and the generation of the capture clock 524 at the eighth time 522 is $T_{delay}$. The data capture clock generator 212 may determine $T_{delay}$ in response to the falling edge of the third waveform 506 at the fifth time 516.

In the first timing diagram 400 of FIG. 4, the time difference between the sixth time 418 and the seventh time 420 is less than the time difference between the seventh time 520 and the eighth time 522 in the second timing diagram 500 of FIG. 5. Advantageously, the data capture clock generator 212 may dynamically generate the capture clock 524 based on $T_{delay}$, which may be determined based on $T_{tran}$.

Figure 6:
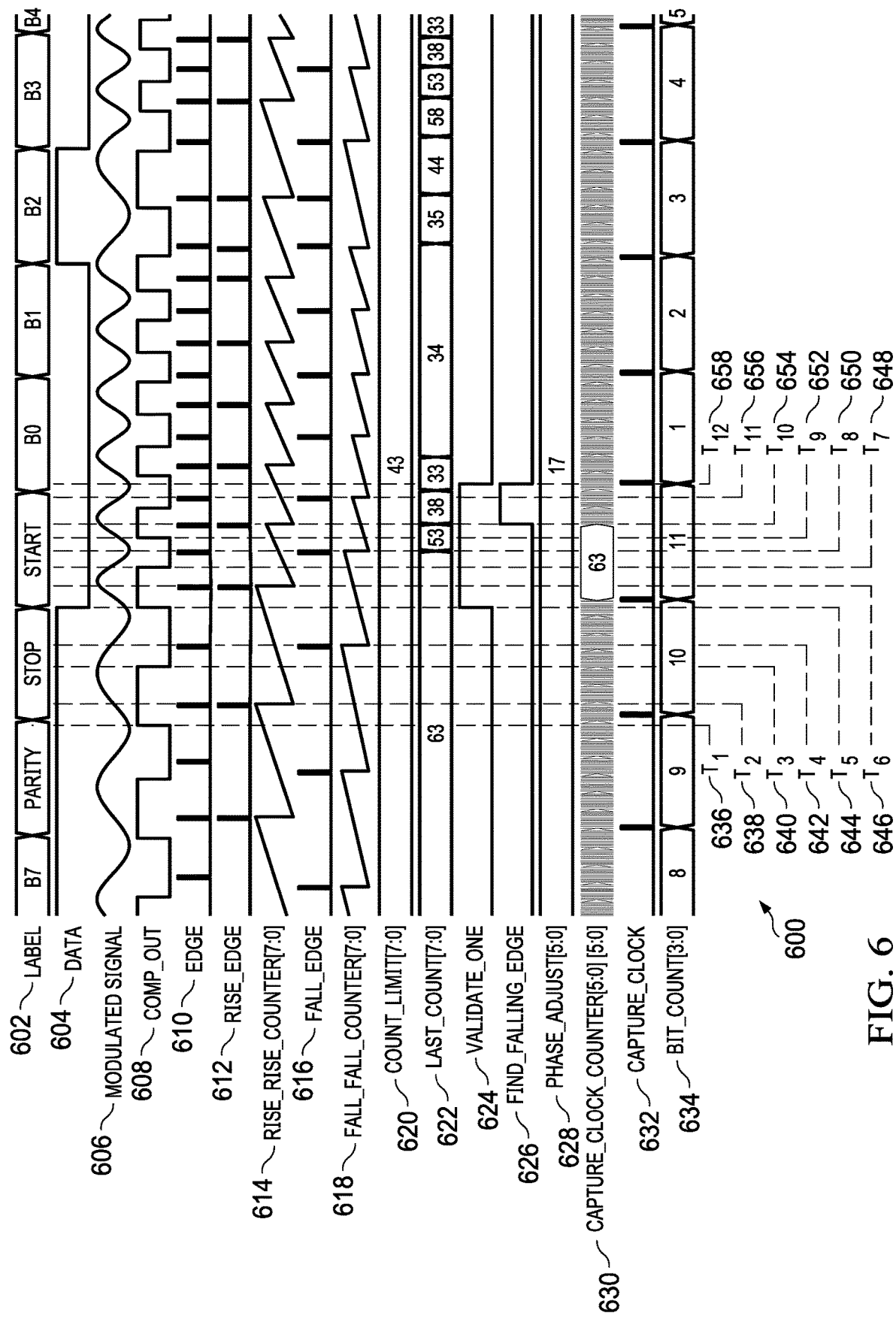

FIG. 6 depicts a third example timing diagram 600 including example waveforms 602, 604, 606, 608, 610, 612, 614, 616, 618, 620, 622, 624, 626, 628, 630, 632, 634 corresponding to example operation of the HART device 100 of FIG. 1 and/or the demodulator system 200 of FIG. 2. The labels 602 represents labels of bits in a HART bitstream. For example, the first bit of the HART bitstream is a start bit (e.g., Start in FIG. 6, the start bit 304 of FIG. 3, etc.), the second through ninth bits are data (e.g., b0 through b7 in FIG. 6), the tenth bit is a parity bit (e.g., Parity in FIG. 6, an odd parity bit, etc.), and the eleventh bit is a stop bit (e.g., Stop in FIG. 6, the stop bit 302 of FIG. 3, etc.). Waveform 604 is a data signal (e.g., a digital data signal). Waveform 604 starts with bit 7 of the data stream on the left of FIG. 6. This bit of data is followed in FIG. 6 with the "parity" bit, the "stop" bit, the "start" bit, etc. Waveform 606 is a modulated signal (e.g. a 4-20 mA signal that is modulated with data 604). Waveform 606 is an example of: a signal received from the field device 126 of FIG. 1, the output of the filter 104 of FIG. 1, the first input signal 216 of FIG. 2, the second input signal 217 of FIG. 2, the output of the filter 202 of FIG. 2, and/or the HART signal 300 of FIG. 3. Waveform 608 is a comparator output signal, which may an example of the output of the comparator 106 of FIG. 1 and/or the comparator 204 of FIG. 2. In some such examples, waveform 608 may illustrate the comparator output signal 220 of FIG. 2.

Waveform 610 is an edge detect signal, which may be generated by the first counter 208, the second counter 210, and/or, more generally, the receive demodulator 206 of FIG. 2. For example, the edge detect signal may be a logic OR of waveform 612 and waveform 616. The waveform 612 is a rise or rising edge detect signal, which may be generated by the first counter 208, the second counter 210, and/or, more generally, the receive demodulator 206 of FIG. 2. For example, the first counter 208 may assert the rise edge detect signal in response to detecting a rising edge of the comparator output signal. Waveform 614 is a first data count signal, which may be generated by the first counter 208 and is equivalent to the first data count signal 222 of FIG. 2.

Waveform 616 is a fall or falling edge detect signal, which may be generated by the first counter 208, the second counter 210, and/or, more generally, the receive demodulator 206 of FIG. 2. For example, the second counter 210 may assert the fall edge detect signal in response to detecting a falling edge of the comparator output signal. Waveform 618 is a second data count signal, which may be generated by the second counter 210 and is equivalent to the second data count signal 224 of FIG. 2.

Waveform 620 is a count limit signal, which may be generated by the data capture clock generator 212 of FIG. 2. For example, the count limit signal may be indicative of a threshold (e.g., a data count threshold). In some examples, the count limit signal may be a high-limit threshold (e.g., a high-limit threshold of 58, 60, etc.). In some examples, the count limit signal may be a low-limit threshold (e.g., a low-limit threshold of 43, 45, etc.).

Waveform 622 is a last count signal, which may be generated by the data capture clock generator 212 of FIG. 2. For example, the last count signal may be a signal (e.g. a digital signal) indicative of a stored value of the first counter 208 or the second counter 210. Waveform 624 is a validate one signal, which may be generated by the data capture clock generator 212 of FIG. 2. For example, the validate one signal may be a signal indicative of a detected transition between a stop bit and a start bit of a bitstream.

Waveform 626 is a find falling edge signal, which may be generated by the data capture clock generator 212 of FIG. 2. For example, the find falling edge signal may indicate a detection of a falling edge of the start bit. Waveform 628 is a phase adjust signal, which may be generated by the data capture clock generator 212 of FIG. 2. For example, the phase adjust signal may be a signal that adjusts a phase of a capture clock from a first phase to a second phase. In some such examples, the phase adjust signal may expedite or delay the generation of the capture clock based on the value of the phase adjust signal. In some examples, the value of the phase adjust signal is static or pre-programmed. In some examples, the value of the phase adjust signal is dynamic. In some examples, the value of the phase adjust signal is programmable such as via a firmware and/or hardware change.

Waveform 630 is a capture clock counter signal, which may be generated by the data capture clock generator 212 of FIG. 2. The capture clock counter signal is a signal that may be used to generate the capture clock. Waveform 632 is a capture clock signal, which may be generated by the data capture clock generator 212 of FIG. 2. For example, the capture clock signal may be the capture clock 226 of FIG. 2, the capture clocks 310 of FIG. 3, the capture clock 422 of FIG. 4, and/or the capture clock 524 of FIG. 5. The capture clock signal may be used to instruct the demodulator 214 of FIG. 2 to demodulate the modulated signal. Waveform 634 is a bit count signal, which may be generated by the data capture clock generator 212 of FIG. 2. For example, the bit count signal may be indicative of the instant location of the bitstream.

Pursuant to the HART protocol, the data signal starts with a start bit and transitions through data to a parity bit (e.g., bit 10 of the bitstream) to a stop bit (e.g., bit 11 of the bitstream). In the example of FIG. 6, the transition from the parity bit to the stop bit occurs at a first example time ($T_1$) 636. At the first time 636, the comparator output signal 608 transitions from a logic low to a logic high signal, which may cause the first counter 208 of FIG. 2 to assert the rise edge signal 612 at a second example time ($T_2$) 638. In response to the detection of the rising edge of the comparator output signal 608, the first counter 208 may store the count value of the first counter 208 as the last count signal 622 and the first counter 208 may reset the first data count signal 614. For example, the measurement of the first counter 208 at the second time 638 may be 63.

At a third example time ($T_3$) 640, the comparator output signal 608 transitions from a logic high to a logic low signal, which may cause the second counter 210 of FIG. 2 to assert the fall edge signal 616 at a fourth example time ($T_4$) 642. In response to the detection of the falling edge of the comparator output signal 608, the second counter 210 may store the count value of the second counter 210 as the last count signal 622 and the second counter 210 may reset the second data count signal 618. For example, the measurement of the second counter 210 at the fourth time 642 may be 63.

In the third timing diagram 600, the data signal 604 transitions from a stop bit (e.g., bit 11 of the bitstream) to a start bit (e.g., bit 1 of the bitstream) at a fifth example time ($T_5$) 644. For example, the fifth time 644 of FIG. 6 may correspond to the third time 412 of FIG. 4 and/or the third time 512 of FIG. 5. At the fifth time 644, the comparator output signal 608 transitions from a logic low to a logic high signal, which may cause the first counter 208 to assert the rise edge signal 612 at a sixth example time ($T_6$) 646. In response to the detection of the rising edge of the comparator output signal 608, the first counter 208 may store the count value of the first counter 208 as the last count signal 622 and the first counter 208 may reset the first data count signal 614. For example, the measurement of the first counter 208 at the sixth time 646 may be 63. At the sixth time 646, the data capture clock generator 212 may assert the validate one signal 624 in response to determining (e.g., in response to a determination) that the transition from the data1 to the data0 has occurred.

At a seventh example time ($T_7$) 648, the comparator output signal 608 transitions from a logic high to a logic low signal, which may cause the second counter 210 to assert the fall edge signal 616 at an eighth example time ($T_8$) 650. For example, the seventh time 648 of FIG. 6 may correspond to the fourth time 414 of FIG. 4 and/or the fifth time 516 of FIG. 5. In response to the detection of the falling edge of the comparator output signal 608, the second counter 210 may store the count value of the second counter 210 as the last count signal 622 and the second counter 210 may reset the second data count signal 618. For example, the measurement of the second counter 210 at the fourth time 642 may be 53. In some such examples, 53 may correspond to a first period of the data1, which may be expressed by a value of the second counter 210 starting from 0 at the fourth time 642 until 53 at the eighth time 650. In some such examples, 53 may be $T_1$ in the example of Equation (1) above. For example, 53 may correspond to a time duration from a first detected falling edge to a second detected falling edge of the comparator output signal 608.

At a ninth example time ($T_9$) 652, the comparator output signal 608 transitions from a logic low to a logic high signal, which may cause the first counter 208 to assert the rise edge signal 612 at a tenth example time ($T_{10}$) 654. In response to the detection of the rising edge of the comparator output signal 608, the data capture clock generator 212 may assert the find falling edge signal 626. In response to the detection of the rising edge of the comparator output signal 608, the first counter 208 may store the count value of the first counter 208 as the last count signal 622 and the first counter 208 may reset the first data count signal 614. For example, the measurement of the first counter 208 at the tenth time 654 may be 38. In some such examples, 38 may correspond to a second period of the data0, which may be expressed by a value of the first counter 208 starting from 0 at the sixth time 646 until 38 at the tenth time 654. In some such examples, 38 may be $T_0$ in the example of Equation (1) above. For example, 38 may correspond to a time duration from a first detected rising edge to a second detected rising edge of the comparator output signal 608.

At an eleventh example time ($T_{11}$) 656 after the comparator output signal 608 transitions from a logic high to a logic low signal, the transition may cause the second counter 210 to assert the fall edge signal 616. For example, the eleventh time 656 of FIG. 6 may correspond to the sixth time 418 of FIG. 4 and/or the seventh time 520 of FIG. 5. In response to the detection of the falling edge of the comparator output signal 608 at the eleventh time 656, the data capture clock generator 212 may assert the capture clock signal 632 at a twelfth example time ($T_{12}$) 658. For example, the data capture clock generator 212 may determine $T_{delay}$ in the example of Equation (1) above based on the first period (e.g., 53) and the second period (e.g., 38). In this example, the data capture clock generator 212 may adjust the phase of the capture clock 632 from a first phase (e.g., 38) to a second phase (e.g., 21) based on the phase adjust signal 628 (e.g., 17). In this example, the phase adjust signal 628 may correspond to $T_{delay}$. For example, the data capture clock generator 212 may assert the capture clock signal 632 21 clock cycles (e.g., 21 clock cycles=38 clock cycles−17 clock cycles) after the detection of the rising edge of the comparator output signal 608 at the tenth time 654. The 21 clock cycles after the detection may correspond to the twelfth time 658. In some examples, the data capture clock generator 212 may generate capture clocks for bit count 1 (e.g., b0), bit count 2 (e.g., b1), bit count 3 (e.g., b2), etc., based on a delay circuit of a baud rate counter.

Figure 7:
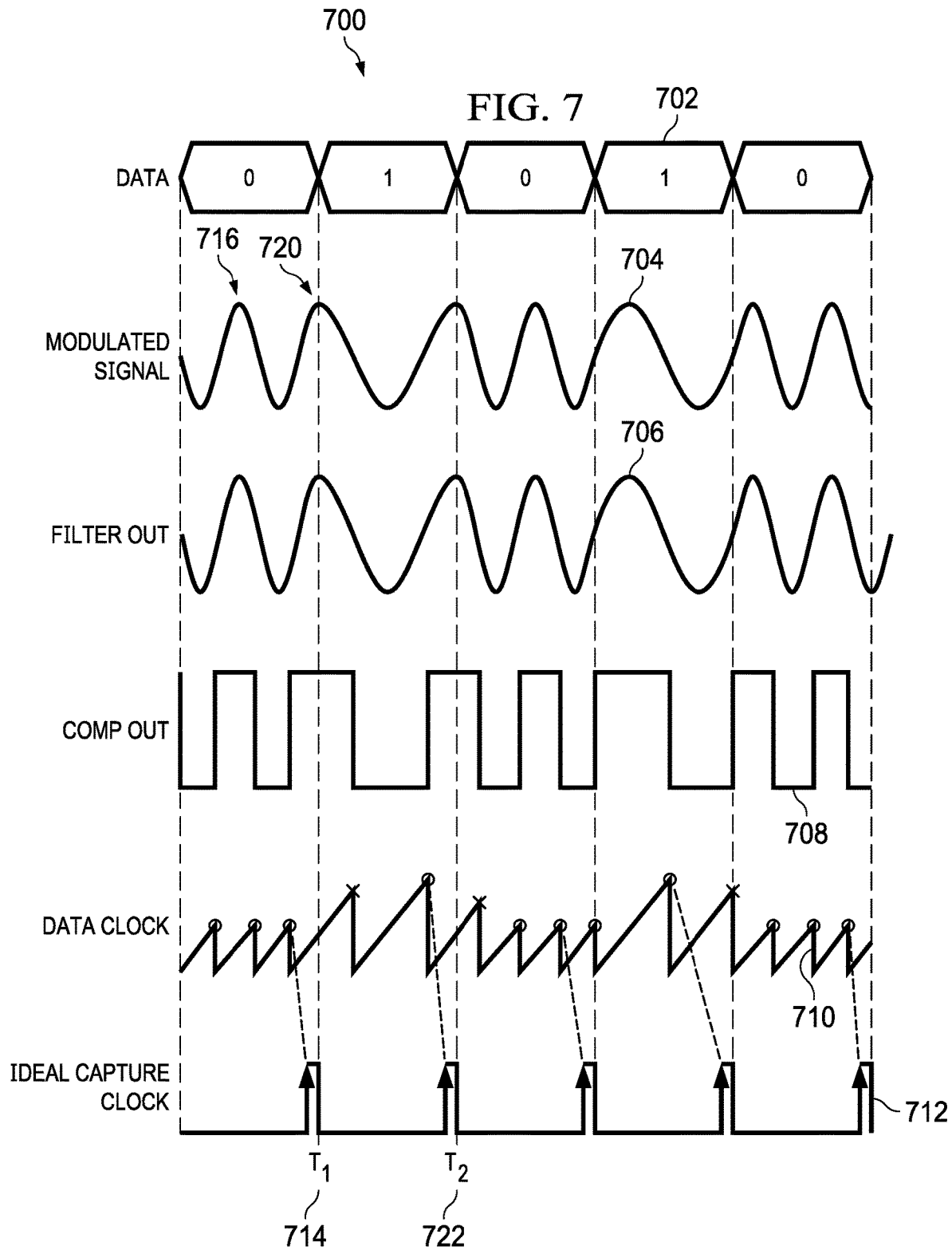
FIG. 7 is another timing diagram corresponding to example operation of another example implementation of the example demodulator of FIGS. 1 and/or 2.

FIG. 7 is a fourth example timing diagram 700 corresponding to example operation of the receive demodulator 102 of FIG. 1. The fourth timing diagram 700 includes example waveforms 702, 704, 706, 708, 710, 712. For example, the first waveform 702 illustrates digital data that is modulated onto a carrier (the modulated carrier depicted as waveform 704). The second waveform 704 may be the modulated signal received from the field device 126 of FIG. 1 and/or the HART signal 300 of FIG. 3. The third waveform 706 is a filtered output. For example, the third waveform 706 may be the output of the filter 104 of FIG. 1 and/or the HART signal 300 of FIG. 3. The fourth waveform 708 is a comparator output signal. For example, the fourth waveform 708 may be the output of the comparator 106 of FIG. 1. The fifth waveform 710 is a data count signal. For example, the data count signal may include data peaks that correspond to a rising or falling edge of the comparator output signal (indicated by circles). The sixth waveform 712 is representative of the ideal capture clock based on the data transitions of the data signal.

In the fourth timing diagram 700, a first ideal capture clock is to be generated at a first example time $(T_1)$ 714 to indicate a transition between a data0 and a data1. In this example, a first peak 716 of the second waveform 704 is within the first data0 and thereby the corresponding data counts are included in the first data 0. A second ideal capture clock is to be generated at a second example time $(T_2)$ 722 to indicate a transition between a data1 and a data0. In this example, a second peak 720 of the second waveform 704 spans the first data0 and the first data1 because of varying phase and slope of the second waveform 704, which causes one of the corresponding data counts to not be included in the first data1 (indicated by an "X"). Advantageously, the demodulator system 200 of FIG. 2 is an improvement over the implementation of the receive demodulator 102 because the demodulator system 200 may predict and/or otherwise determine a time delay (e.g., $T_{delay}$) to be used to generate a capture clock to reduce the likelihood that data capture does not fail as depicted in the example of FIG. 7.

Figure 8:
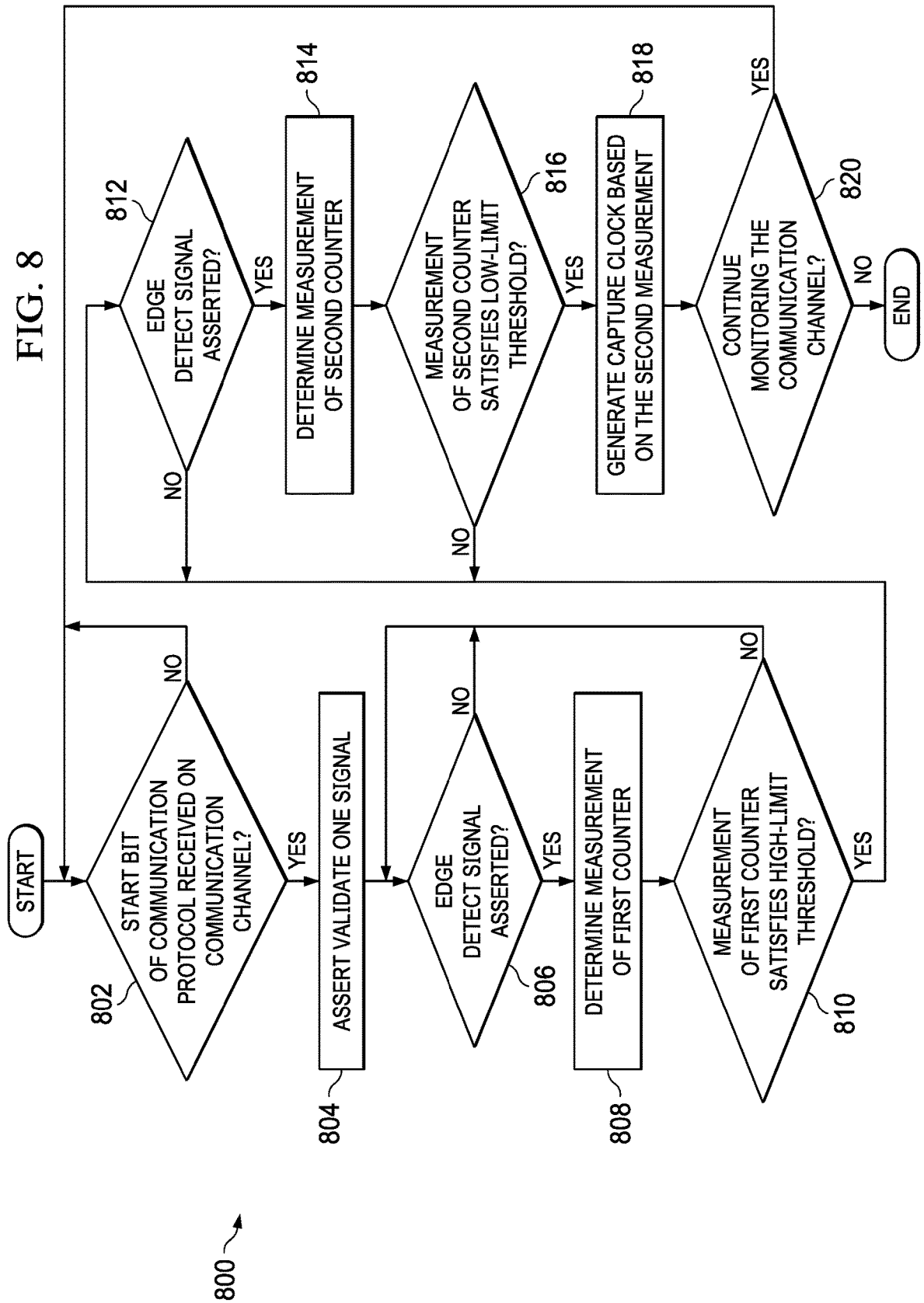
FIG. 8 is a flowchart representative of an example process that may be performed using machine readable instructions that can be executed and/or hardware configured to implement the example demodulator of FIG. 2, and/or, more generally, the example HART device of FIG. 1 to adjust a data capture clock based on a modulated signal.

A flowchart representative of an example process that may be performed using example hardware logic, example machine readable instructions (such as hardware readable instructions), example hardware implemented state machines, and/or any combination thereof configured to implement the example filter 104, the example comparator 106, the example receive demodulator 102, and/or, more generally, the example HART device 100 of FIG. 1, and/or the example demodulation system 200 of FIG. 2 or portion(s) thereof is shown in FIG. 8. The example machine readable instructions may be one or more executable programs or portion(s) of an executable program for execution by programmable processor(s) (such as programmable microprocessor(s)), programmable controller(s), GPU(s), DSP(s), ASIC(s), PLD(s), and/or FPLD(s). The program may be embodied in software stored on a non-transitory computer readable storage medium (such as electrically erasable programmable read-only memory (EEPROM), non-volatile memory, volatile memory, etc.), but the entire program and/or parts thereof could alternatively be executed by any other device (such as a programmable device) and/or embodied in firmware or dedicated hardware. Further, although the example program(s) is/are described with reference to the flowchart illustrated in FIG. 8, many other methods of and/or techniques implementing the example filter 104, the example comparator 106, the example receive demodulator 102, and/or, more generally, the example HART device 100 of FIG. 1, and/or the example demodulation system 200 of FIG. 2 or portion(s) thereof may alternatively be used. For example, the order of execution of the blocks may be changed, and/or some of the blocks described may be changed, eliminated, or combined. Additionally or alternatively, any or all of the blocks may be implemented by one or more hardware circuits (such as discrete and/or integrated analog and/or digital circuitry, an FPGA, an ASIC, a comparator, an operational-amplifier (op-amp), a logic circuit, etc.) structured to perform the corresponding operation without executing software or firmware.

The machine readable instructions described herein may be stored in one or more of a compressed format, an encrypted format, a fragmented format, a compiled format, an executable format, a packaged format, etc. Machine readable instructions as described herein may be stored as data (such as portions of instructions, code, representations of code, etc.) useful to create, manufacture, and/or produce machine executable instructions. For example, the machine readable instructions may be fragmented and stored on one or more storage devices. The machine readable instructions may require one or more of installation, modification, adaptation, updating, combining, supplementing, configuring, decryption, decompression, unpacking, distribution, reassignment, compilation, etc., in order to make them directly readable, interpretable, and/or executable by a computing device and/or other machine. For example, the machine readable instructions may be stored in multiple parts, which are individually compressed, encrypted, and stored on separate computing devices, wherein the parts when decrypted, decompressed, and combined form a set of executable instructions that implement a program such as that described herein.

The machine readable instructions described herein can be represented by any past, present, or future instruction language, scripting language, programming language, etc. For example, the machine readable instructions may be represented using any of the following languages: assembly language, C, C++, Java, C #, Perl, Python, JavaScript, HyperText Markup Language (HTML), Structured Query Language (SQL), Swift, etc.

As described above, the example process of FIG. 8 may be implemented using executable instructions (such as computer, machine, and/or hardware readable instructions) stored on a non-transitory computer and/or machine readable medium, such as a flash memory, a read-only memory, a cache, a random-access memory, and/or any other storage device or storage disk in which information is stored for any duration (such as for extended time periods, permanently, for brief instances, for temporarily buffering, and/or for caching of the information). As used herein, the terms non-transitory computer readable medium, non-transitory machine readable medium, and/or non-transitory hardware readable medium is/are expressly defined to include any type of computer, machine, and/or hardware readable storage device and/or storage disk and to exclude propagating signals and to exclude transmission media.

FIG. 8 is a flowchart representative of an example process 800 that may be performed using machine readable instructions that can be executed and/or hardware configured to implement the example comparator 106 of FIG. 1, the example receive demodulator 102 of FIG. 1, and/or, more generally, the example HART device 100 of FIG. 1, and/or the example demodulation system 200 of FIG. 2 or portion(s) thereof to generate a data capture clock based on a modulated signal. The example process of FIG. 8 begins at block 802, at which the receive demodulator 102 and/or the demodulation system 200 may determine whether a start bit of a communication protocol is received on a communication channel. For example, the data capture clock generator 212 of FIG. 2 may determine that a start bit is received on a HART communication channel of the HART device 100 in response to detecting a transition between the stop bit and the start bit at the sixth time 646 of FIG. 6.

If, at block 802, the receive demodulator 102 and/or the demodulation system 200 determine that a start bit of a communication protocol is not received on a communication channel, control waits until a start bit is received. If, at block 802, the receive demodulator 102 and/or the demodulation system 200 determine that a start bit of a communication protocol is received on a communication channel, then, at block 804, the receive demodulator 102 and/or the demodulation system 200 assert a validate one signal. For example, the data clock generator 212 may assert the validate one signal 624 at the sixth time 646. In some such examples, the first counter 208 may be reset at the sixth time 646.

In response to asserting the validate one signal at block 804, the receive demodulator 102 and/or the demodulation system 200 determine whether an edge detect signal is asserted at block 806. For example, the second counter 210 may assert the fall edge signal 616 at the eighth time 650 in response to detecting a falling edge of the comparator output signal 608.

If, at block 806, the receive demodulator 102 and/or the demodulation system 200 determine that an edge detect signal is not asserted, control waits until an edge detect signal is detected. If, at block 806, the receive demodulator 102 and/or the demodulation system 200 determine that an edge detect signal is asserted, then, at block 808, the receive demodulator 102 and/or the demodulation system 200 determine a measurement of a first counter. For example, in response to the detection of the falling edge of the comparator output signal 608 at the eighth time 650, the second counter 210 may store a value of the second counter 210. In some such examples, the value of the second counter 210 may be 63 at the eighth time 650.

At block 810, the receive demodulator 102 and/or the demodulation system 200 determine whether a measurement of a first counter satisfies a high-limit threshold. For example, the data capture clock generator 212 may determine that the value of 63 of the second counter 210 is greater than a high-limit threshold of 58 and the value of 63 thereby satisfies the high-limit threshold.

If, at block 810, the receive demodulator 102 and/or the demodulation system 200 determine that the measurement of the first counter does not satisfy the high-limit threshold, control returns to block 806 to determine whether another edge detect signal is asserted. If, at block 810, the receive demodulator 102 and/or the demodulation system 200 determine that the measurement of the first counter satisfies the high-limit threshold, then, at block 812, the receive demodulator 102 and/or the demodulation system 200 determine whether an edge detect signal is asserted. For example, the first counter 208 may assert the rise edge signal 612 at the tenth time 654 in response to detecting a rising edge of the comparator output signal 608.

If, at block 812, the receive demodulator 102 and/or the demodulation system 200 determine that an edge detect signal is not asserted, control waits until an edge detect signal is detected. If, at block 812, the receive demodulator 102 and/or the demodulation system 200 determine that an edge detect signal is asserted, then, at block 814, the receive demodulator 102 and/or the demodulation system 200 determine a measurement of a second counter. For example, in response to the detection of the rising edge of the comparator output signal 608 at the tenth time 654, the first counter 208 may store a value of the first counter 208. In some such examples, the value of the first counter 208 may be 38 at the tenth time 654.

At block 816, the receive demodulator 102 and/or the demodulation system 200 determine whether a measurement of a second counter satisfies a low-limit threshold. For example, the data capture clock generator 212 may determine that the value of 38 of the first counter 208 satisfies a low-limit threshold of 43 because the value of 38 is less than the low-limit threshold.

If, at block 816, the receive demodulator 102 and/or the demodulation system 200 determine that the measurement of the second counter does not satisfy the low-limit threshold, control returns to block 812 to determine whether another edge detect signal is asserted. If, at block 812, the receive demodulator 102 and/or the demodulation system 200 determine that the measurement of the second counter satisfies the low-limit threshold, then, at block 818, the receive demodulator 102 and/or the demodulation system 200 generate a capture clock based on the second measurement. For example, the data capture clock generator 212 may generate a capture clock by asserting the capture clock signal 632 at the twelfth time 658. In some such examples, the data capture clock generator 212 may generate the capture clock based on the value of the first counter 208 of 38 and a value of 17 the phase adjustment signal 628.

In response to generating the capture clock based on the second measurement at block 818, the receive demodulator 102 and/or the demodulation system 200 determine whether to continue monitoring the communication channel at block 820. For example, the demodulation system 200 may determine that another bit of the HART bit stream has been received. If, at block 820, the receive demodulator 102 and/or the demodulation system 200 determine to continue monitoring the communication channel, control returns to block 802 to determine whether another start bit of the communication protocol is received on the communication channel, otherwise the example process 800 of FIG. 8 concludes.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

Example systems, methods, apparatus, and articles of manufacture described herein improve demodulation ability of asynchronous HART FSK signals by a phase prediction method. Advantageously, example systems, methods, apparatus, and articles of manufacture described herein reduce a failure rate of HART demodulation based on a 1-bit comparator architecture. Advantageously, example systems, methods, apparatus, and articles of manufacture described herein improve noise sensitivity by increasing tolerance against injected noise and waveform shape variations, which may cause demodulation failures. Example systems, methods, apparatus, and articles of manufacture described herein regenerate a data capture clock from a FSK analog waveform and demodulated data. Example systems, methods, apparatus, and articles of manufacture described herein implement a 1-bit demodulator as a small and low-power solution compared with conventional ADC implementations.

Example methods, apparatus, systems, and articles of manufacture for phase prediction demodulator circuits and related method are disclosed herein. Further examples and combinations thereof include the following:

Example 1 includes an apparatus comprising an input adapted to receive a signal modulated with data, counter circuitry coupled to the input and operable to determine a first count value in response to a first period between a first rising edge of the signal and a second rising edge of the signal, the first rising edge indicative of a start bit of the data, and determine a second count value based on a second period between a first falling edge of the signal and a second falling edge of the signal, data capture clock circuitry coupled to the counter circuitry and operable to generate a data capture clock based on the first count value in response to the second count value satisfying a threshold, and demodulator circuitry coupled to the counter circuitry and the data capture clock circuitry, the demodulator circuitry operable to generate a demodulated signal based on the data capture clock.

Example 2 includes the apparatus of example 1, wherein the data capture clock circuitry is to generate the data capture clock based on an adjustment of a phase of the data capture clock from a first phase to a second phase, the adjustment based on the first count value.

Example 3 includes the apparatus of example 2, wherein the start bit is a first start bit, and wherein after a detection of a second start bit of a second bit stream, the counter circuitry is to determine a third count value based on the signal in response to a third rising edge of the signal, and the data capture clock circuitry is to adjust the phase of the data capture clock from the second phase to a third phase based on the third count value, the third phase different from the first phase, the adjustment of the phase from the second phase to the third phase in response to a fourth count value of the counter circuitry satisfying the threshold.

Example 4 includes the apparatus of example 1, further including comparator circuitry to generate the first rising edge of the signal, the counter circuitry to reset in response to the first rising edge, and generate the first falling edge of the signal, the counter circuitry to reset in response to the first falling edge.

Example 5 includes the apparatus of example 1, wherein the threshold is a first threshold, and wherein the counter circuitry is to determine a third count value in response to the first rising edge, and the data capture clock circuitry is to determine that the third count value satisfies a second threshold, and detect the start bit in response to the determination that the third count value satisfies the second threshold.

Example 6 includes the apparatus of example 1, further including comparator circuitry with a first output coupled to a first input of the counter circuitry.

Example 7 includes the apparatus of example 1, wherein the counter circuitry has an output coupled to an input of the data capture clock circuitry.

Example 8 includes the apparatus of example 1, wherein the data capture clock circuitry has an output coupled to an input of the demodulator circuitry.

Example 9 includes the apparatus of example 8, wherein the output is a first output, the input is a first input, and a second output of the counter circuitry is coupled to a second input of the demodulator circuitry.

Example 10 includes a system comprising a comparator circuit with a comparator input and a comparator output, the comparator input adapted to receive an input signal that is modulated with data, the comparator circuit operable to output, responsive to the input signal, a comparator signal having rising edges and falling edges, and a demodulator circuit with a demodulator input and a demodulator output, the demodulator input coupled to the comparator output, the demodulator circuit operable to determine a first count value based on a first period between a first rising edge and a second rising edge of the comparator signal, determine a second count value based on a second period between a first falling edge and a second falling edge of the comparator signal, generate a data capture clock based on the first count value in response to the second count value satisfying a threshold, and generate a demodulated signal based on the data capture clock and the input signal.

Example 11 includes the system of example 10, wherein the input signal is a Highway Addressable Remote Transducer (HART) signal.

Example 12 includes the system of example 11, further comprising a HART circuit with a HART input coupled to the demodulator output, the HART circuit to determine a HART parameter based on the demodulated signal.

Example 13 includes the system of example 10, wherein the demodulator circuit is to generate the data capture clock based on an adjustment of a phase of the data capture clock from a first phase to a second phase, the adjustment based on the first count value.

Example 14 includes the system of example 13, wherein the demodulator circuit is to after a detection of a start bit of a bit stream associated with the data, determine a third count value based on the input signal in response to a rising edge of the input signal at a second time, and adjust the phase of the data capture clock from the second phase to a third phase based on the third count value, the third phase different from the first phase, the adjustment of the phase from the second phase to the third phase in response to a fourth count value satisfying the threshold.

Example 15 includes the system of example 10, wherein the comparator circuit is to generate a rising edge of the input signal, the demodulator circuit to reset a first counter in response to the rising edge, and generate a falling edge of the input signal, the demodulator circuit to reset a second counter in response to the falling edge.

Example 16 includes the system of example 10, wherein the threshold is a first threshold, and wherein the demodulator circuit is to determine a third count value determine that the third count value satisfies a second threshold, and detect a start bit in response to the determination that the third count value satisfies the second threshold.

Example 17 includes a method comprising resetting a first counter in response to a first rising edge of a signal, the first rising edge to identify a start bit of a bit stream at a first time, resetting a second counter in response to a first falling edge of the signal at a second time, determining a first count value of the first counter in response to a second rising edge of the signal at a third time, and in response to a second count value of the second counter satisfying a threshold, adjusting a phase of a data capture clock from a first phase to a second phase based on the first count value.

Example 18 includes the method of example 17, further including generating a demodulated signal based on the adjusted phase of the data capture clock.

Example 19 includes the method of example 17, wherein the threshold is a low-limit threshold, and further including determining a third count value of the first counter at the first time, and in response to determining that the third count value satisfies a high-limit threshold, detecting the start bit.

Example 20 includes the method of example 17, wherein the start bit is a first start bit, the bit stream is a first bit stream, and further including in response to detecting a second start bit of a second bit stream, determining a third count value of the first counter in response to a third rising edge of the signal at a fourth time, and in response to a fourth count value of the second counter satisfying the threshold, adjusting the phase of the data capture clock from the second phase to a third phase based on the third count value, the third phase different from the first phase.

Example 21 includes the method of example 17, further including detecting the start bit after detecting a stop bit of the bit stream.

Example 22 includes the method of example 17, wherein the bit stream is generated based on a Highway Addressable Remote Transducer communication protocol.

Example 23 includes an apparatus comprising a comparator circuit with a first comparator output and a second comparator output, a first counter circuit with a first counter input and a first counter output, the first counter input coupled to the first comparator output, a second counter circuit with a second counter input and a second counter output, the second counter input coupled to the second comparator output, a data capture clock circuit with a first input, a second input, and a first output, the first input coupled to the first counter output, the second input coupled to the second counter output, and a demodulator circuit with a first demodulator input, a second demodulator input, and a third demodulator input, the first demodulator input coupled to the first counter output, the second demodulator input coupled to the second counter output, the third demodulator input coupled to the first output.

Example 24 includes the apparatus of example 23, further including a filter circuit with a filter input and a filter output, the filter output coupled to a comparator input of the comparator circuit, the filter input adapted to be coupled to an output of a field device.

Example 25 includes the apparatus of example 23, wherein the demodulator circuit has a demodulator output adapted to be coupled to a modulator input of a modulator circuit.

Example 26 includes the apparatus of example 23, wherein the demodulator circuit has a demodulator output adapted to be coupled to a third input of a Highway Addressable Remote Transducer modem.

Example 27 includes the apparatus of example 23, wherein the first counter circuit is to determine a first count value in response to a second rising edge of a signal after a generation of a first rising edge of the signal, the first rising edge to identify a start bit of a bit stream, the second counter circuit is to determine a second count value based on the signal in response to a second falling edge generated after a first falling edge, the data capture clock circuit is to generate a data capture clock based on the first count value in response to the second count value satisfying a threshold, and the demodulator circuit is to generate a demodulated signal based on the data capture clock.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party. Circuits described herein are reconfigurable to include the replaced components to provide functionality at least partially similar to functionality available prior to the component replacement.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value.

Modifications are possible in the described embodiments, and other embodiments are possible, within the scope of the claims.

What is claimed is:

1. An apparatus comprising:
an input adapted to receive a signal modulated with data;
counter circuitry coupled to the input and operable to:
determine a first count value in response to a first period between a first rising edge of the signal and a second rising edge of the signal, the first rising edge indicative of a start bit of the data; and
determine a second count value based on a second period between a first falling edge of the signal and a second falling edge of the signal;
data capture clock circuitry coupled to the counter circuitry and operable to generate a data capture clock based on the first count value in response to the second count value satisfying a threshold; and
demodulator circuitry coupled to the counter circuitry and the data capture clock circuitry, the demodulator circuitry operable to generate a demodulated signal based on the data capture clock.

2. The apparatus of claim 1, wherein the data capture clock circuitry is to generate the data capture clock based on an adjustment of a phase of the data capture clock from a first phase to a second phase, the adjustment based on the first count value.

3. The apparatus of claim 2, wherein the start bit is a first start bit, and wherein:
after a detection of a second start bit of a second bit stream, the counter circuitry is to determine a third count value based on the signal in response to a third rising edge of the signal; and the data capture clock circuitry is to adjust the phase of the data capture clock from the second phase to a third phase based on the third count value, the third phase different from the first phase, the adjustment of the phase from the second phase to the third phase in response to a fourth count value of the counter circuitry satisfying the threshold.

4. The apparatus of claim 1, further including comparator circuitry to:
generate the first rising edge of the signal, the counter circuitry to reset in response to the first rising edge; and
generate the first falling edge of the signal, the counter circuitry to reset in response to the first falling edge.

5. The apparatus of claim 1, wherein the threshold is a first threshold, and wherein:
the counter circuitry is to determine a third count value in response to the first rising edge; and
the data capture clock circuitry is to:
determine that the third count value satisfies a second threshold; and
detect the start bit in response to the determination that the third count value satisfies the second threshold.

6. The apparatus of claim 1, further including comparator circuitry with a first output coupled to a first input of the counter circuitry.

7. The apparatus of claim 1, wherein the counter circuitry has an output coupled to an input of the data capture clock circuitry.

8. The apparatus of claim 1, wherein the data capture clock circuitry has an output coupled to an input of the demodulator circuitry.

9. The apparatus of claim 8, wherein the output is a first output, the input is a first input, and a second output of the counter circuitry is coupled to a second input of the demodulator circuitry.

10. A system comprising:
a comparator circuit with a comparator input and a comparator output, the comparator input adapted to receive an input signal that is modulated with data, the comparator circuit operable to output, responsive to the input signal, a comparator signal having rising edges and falling edges; and
a demodulator circuit with a demodulator input and a demodulator output, the demodulator input coupled to the comparator output, the demodulator circuit operable to:
determine a first count value based on a first period between a first rising edge and a second rising edge of the comparator signal;
determine a second count value based on a second period between a first falling edge and a second falling edge of the comparator signal;
generate a data capture clock based on the first count value in response to the second count value satisfying a threshold; and
generate a demodulated signal based on the data capture clock and the input signal.

11. The system of claim 10, wherein the input signal is a Highway Addressable Remote Transducer (HART) signal.

12. The system of claim 11, further comprising: a HART circuit with a HART input coupled to the demodulator output, the HART circuit to determine a HART parameter based on the demodulated signal.

13. The system of claim 10, wherein the demodulator circuit is to generate the data capture clock based on an adjustment of a phase of the data capture clock from a first phase to a second phase, the adjustment based on the first count value.

14. The system of claim 13, wherein the demodulator circuit is to:
after a detection of a start bit of a bit stream associated with the data, determine a third count value based on the input signal in response to a rising edge of the input signal at a second time; and
adjust the phase of the data capture clock from the second phase to a third phase based on the third count value, the third phase different from the first phase, the adjustment of the phase from the second phase to the third phase in response to a fourth count value satisfying the threshold.

15. The system of claim 10, wherein the comparator circuit is to:
generate a rising edge of the input signal, the demodulator circuit to reset a first counter in response to the rising edge; and
generate a falling edge of the input signal, the demodulator circuit to reset a second counter in response to the falling edge.

16. The system of claim 10, wherein the threshold is a first threshold, and wherein the demodulator circuit is to:
determine a third count value:
determine that the third count value satisfies a second threshold; and
detect a start bit in response to the determination that the third count value satisfies the second threshold.

17. A method comprising:
resetting a first counter in response to a first rising edge of a signal, the first rising edge to identify a start bit of a bit stream at a first time;
resetting a second counter in response to a first falling edge of the signal at a second time;
determining a first count value of the first counter in response to a second rising edge of the signal at a third time; and
in response to a second count value of the second counter satisfying a threshold, adjusting a phase of a data capture clock from a first phase to a second phase based on the first count value.

18. The method of claim 17, further including generating a demodulated signal based on the adjusted phase of the data capture clock.

19. The method of claim 17, wherein the threshold is a low-limit threshold, and further including:
determining a third count value of the first counter at the first time; and
in response to determining that the third count value satisfies a high-limit threshold, detecting the start bit.

20. The method of claim 17, wherein the start bit is a first start bit, the bit stream is a first bit stream, and further including:
in response to detecting a second start bit of a second bit stream, determining a third count value of the first counter in response to a third rising edge of the signal at a fourth time; and
in response to a fourth count value of the second counter satisfying the threshold, adjusting the phase of the data capture clock from the second phase to a third phase based on the third count value, the third phase different from the first phase.

21. The method of claim 17, further including detecting the start bit after detecting a stop bit of the bit stream.

22. The method of claim 17, wherein the bit stream is generated based on a Highway Addressable Remote Transducer communication protocol.

23. An apparatus comprising:
a comparator circuit with a first comparator output and a second comparator output;
a first counter circuit with a first counter input and a first counter output, the first counter input coupled to the first comparator output;
a second counter circuit with a second counter input and a second counter output, the second counter input coupled to the second comparator output;
a data capture clock circuit with a first input, a second input, and a first output, the first input coupled to the first counter output, the second input coupled to the second counter output; and
a demodulator circuit with a first demodulator input, a second demodulator input, and a third demodulator input, the first demodulator input coupled to the first counter output, the second demodulator input coupled to the second counter output, the third demodulator input coupled to the first output.

24. The apparatus of claim 23, further including a filter circuit with a filter input and a filter output, the filter output coupled to a comparator input of the comparator circuit, the filter input adapted to be coupled to an output of a field device.

25. The apparatus of claim 23, wherein the demodulator circuit has a demodulator output adapted to be coupled to a modulator input of a modulator circuit.

26. The apparatus of claim 23, wherein the demodulator circuit has a demodulator output adapted to be coupled to a third input of a Highway Addressable Remote Transducer modem.

27. The apparatus of claim 23, wherein:
the first counter circuit is to determine a first count value in response to a second rising edge of a signal after a generation of a first rising edge of the signal, the first rising edge to identify a start bit of a bit stream;
the second counter circuit is to determine a second count value based on the signal in response to a second falling edge generated after a first falling edge;
the data capture clock circuit is to generate a data capture clock based on the first count value in response to the second count value satisfying a threshold; and
the demodulator circuit is to generate a demodulated signal based on the data capture clock.

* * * * *